(12) United States Patent
Sato et al.

(10) Patent No.: US 9,721,814 B2
(45) Date of Patent: Aug. 1, 2017

(54) SUBSTRATE PROCESSING APPARATUS

(71) Applicant: DAINIPPON SCREEN MFG. CO., LTD, Kyoto-shi, Kyoto (JP)

(72) Inventors: Masanobu Sato, Kyoto (JP); Hiroyuki Yashiki, Kyoto (JP)

(73) Assignee: SCREEN HOLDINGS CO., LTD., Kyoto (JP)

(*) Notice: Subject to any disclaimer, the term of this patent is extended or adjusted under 35 U.S.C. 154(b) by 813 days.

(21) Appl. No.: 14/206,902

(22) Filed: Mar. 12, 2014

(65) Prior Publication Data

US 2014/0261586 A1 Sep. 18, 2014

(30) Foreign Application Priority Data

Mar. 13, 2013 (JP) ................................. 2013-049861

(51) Int. Cl.
*H01L 21/304* (2006.01)
*H01L 21/67* (2006.01)

(52) U.S. Cl.
CPC .. *H01L 21/67051* (2013.01); *H01L 21/67253* (2013.01)

(58) Field of Classification Search
CPC ..................................................... H01L 21/304
See application file for complete search history.

(56) References Cited

U.S. PATENT DOCUMENTS

| | | |
|---|---|---|
| 2003/0059534 A1 | 3/2003 | Nishijima et al. |
| 2011/0031326 A1 | 2/2011 | Sato |
| 2011/0286738 A1 | 11/2011 | Noda et al. |
| 2012/0222707 A1 | 9/2012 | Sato et al. |
| 2013/0020284 A1 | 1/2013 | Osada et al. |

FOREIGN PATENT DOCUMENTS

| | | |
|---|---|---|
| CN | 102891096 A | 1/2013 |
| JP | 2006-269849 A | 10/2006 |
| JP | 2010-56376 | 3/2010 |
| JP | 2010-131773 A | 6/2010 |
| JP | 2011-233571 A | 11/2011 |

(Continued)

OTHER PUBLICATIONS

English machine translation of 10-2010-137363A.*

*Primary Examiner* — Michael Barr
*Assistant Examiner* — Jason Riggleman
(74) *Attorney, Agent, or Firm* — McDermott Will & Emery LLP

(57) ABSTRACT

In a substrate processing apparatus, an election head from a position above a substrate held by a substrate holding part to an inspection position above a standby pod disposed outside a cup part. At the inspection position, a processing liquid ejected from the ejection head toward the standby pod is irradiated with planar light emitted from a light emitting part. An imaging part acquires an inspection image including bright dots appearing on the processing liquid, and a determination part determines the quality of the ejection operation of the ejection head on the basis of the inspection image. Accordingly, it is possible to eliminate the influence of reflected light from the substrate and droplets, mist, or the like of the processing liquid having collided with the substrate and to accurately determine the quality of the ejection operation of the ejection head.

20 Claims, 6 Drawing Sheets

(56) References Cited

FOREIGN PATENT DOCUMENTS

| | | |
|---|---|---|
| JP | 2012-9812 | 1/2012 |
| JP | 2012-106148 A | 6/2012 |
| JP | 2012-182320 A | 9/2012 |
| JP | 2012-209513 A | 10/2012 |
| KR | 2001-0039897 A | 5/2001 |
| KR | 10-2010-137363 A * | 12/2010 |
| KR | 10-2010-0137363 A | 12/2010 |

* cited by examiner

SUBSTRATE PROCESSING APPARATUS

TECHNICAL FIELD

The present invention relates to a substrate processing apparatus for processing a substrate.

BACKGROUND ART

The process of manufacturing semiconductor substrates (hereinafter, simply referred to as "substrates") conventionally involves various types of processing performed by a substrate processing apparatus on substrates having an insulation film such as an oxide film. One example is cleaning processing for removing particles or the like adhering to the surface of a substrate by supplying a cleaning liquid to the surface of the substrate.

In a substrate cleaning device disclosed in Japanese Patent Application Laid-Open No. 2010-56376 (Document 1), a piezoelectric element vibrates a cleaning liquid retained in a cylindrical body of a cleaning nozzle so as to cause a plurality of outlets to eject droplets of the cleaning fluid toward a substrate. In a substrate processing apparatus disclosed in Japanese Patent Application Laid-Open No. 2012-182320 (Document 2), a nozzle for ejecting droplets of a processing liquid toward a substrate is provided with a plurality of rows of outlets. In a substrate processing apparatus disclosed in Japanese Patent Application Laid-Open No. 2012-209513 (Document 3), a nozzle having a plurality of rows of outlets are moved along a track that passes through the center of rotation of the substrate.

Japanese Patent Application Laid-Open No. 2012-9812 (Document 4) discloses a liquid processing device in which a processing liquid is supplied onto a substrate from 11 nozzles that are arranged in a straight line. With this device, areas ranging from the tips of these nozzles to the surface of the substrate are irradiated with lines of laser light, and images of liquid columns of a resist liquid ejected from the respective nozzles are captured with a camera directed to the areas. The result of the image capture is then compared with reference information, which is obtained in advance by capturing images of the resist liquid ejected normally from the nozzles, so as to determine whether or not the resist liquid is ejected from each of the nozzles and whether or not there is a change in the ejection state.

Incidentally, if substrate processing apparatuses as disclosed in Documents 1 to 3 are used to observe a processing liquid ejected from nozzles toward a substrate as in Document 4, reflected light from the substrate may enter the camera. There is also a concern about the influence that droplets, mist, or the like of the processing liquid having collided with the substrate would have on the accuracy of inspection. It is also conceivable that disposing constituent elements such as a camera and a light source at appropriate positions may be difficult due to a variety of structures, such as a cup part for receiving a processing liquid dispersed from a substrate being disposed around the substrate.

SUMMARY OF INVENTION

The present invention is intended for a substrate processing apparatus for processing a substrate, and it is an object of the present invention to accurately determine the quality of ejection operations.

The substrate processing apparatus according to the present invention includes a substrate holding part for holding a substrate, a cup part surrounding the substrate holding part, an ejection head disposed above the substrate holding part inside the cup part and for ejecting a processing liquid toward the substrate, a standby pod disposed outside the cup part and in which a lower end portion of the ejection head is housed when the ejection head is on standby, a supply part movement mechanism for moving the ejection head from a position above the substrate holding part to an inspection position above the standby pod, a light emitting part for emitting light along a predetermined light existing plane to irradiate the processing liquid that is ejected from the ejection head toward the standby pod with light when the projection liquid passes through the light existing plane, the ejection head being located at the inspection position, an imaging part for capturing an image of the processing liquid passing through the light existing plane to acquire an inspection image that includes a bright dot appearing on the processing liquid, and a determination part for determining quality of an ejection operation of the ejection head on the basis of the inspection image. With the substrate processing apparatus, it is possible to accurately determine the quality of ejection operations.

In a preferred embodiment of the present invention, the light existing plane passes through a gap between a lower end of the ejection head located at the inspection position and an upper end of the standby pod.

In another preferred embodiment of the present invention, the substrate processing apparatus further includes an imaging-part cleaning part for cleaning a front surface of the imaging part in an imaging direction of the imaging part.

In another preferred embodiment of the present invention, the substrate processing apparatus further includes a light-emitting-part cleaning part for cleaning a front surface of the light emitting part in a light emitting direction of the light emitting part.

In another preferred embodiment of the present invention, a projected imaging axis and a projected optical axis have a point of intersection, the projected imaging axis being obtained by projecting an imaging axis of the imaging part in an ejection direction in which the ejection head ejects a processing liquid, on a projection plane perpendicular to the ejection direction, and the projected optical axis being obtained by projecting an optical axis of the light emitting part in the ejection direction on the projection plane, and an angle formed by a portion of the projected imaging axis between the point of intersection and the imaging part and a portion of the projected optical axis between the point of intersection and the light emitting part is greater than 90 degrees.

In another preferred embodiment of the present invention, the substrate processing apparatus further includes a light-tight chamber having an internal space in which the ejection head, the light emitting part, and the imaging part are housed, and for preventing entry of light into the internal space from outside.

In another preferred embodiment of the present invention, the ejection head includes a plurality of outlets, each ejecting the processing liquid, the light emitting part irradiates a plurality of flying droplets passing through the light existing plane with light, the plurality of flying droplets being the processing liquid ejected from the plurality of outlets, the imaging part captures an image of the plurality of flying droplets passing through the light existing plane to acquire the inspection image that includes a plurality of bright dots appearing on the plurality of flying droplets, and the determination part determines quality of an ejection operation of each of the plurality of outlets on the basis of the inspection image.

In another preferred embodiment of the present invention, the substrate processing apparatus further includes a maintenance part for performing maintenance of the ejection head, and a maintenance control part for, when the determination part detects a failure in the ejection operation of the ejection head, controlling the supply part movement mechanism and the maintenance part to move the ejection head down from the inspection position and perform maintenance of the ejection head with the lower end portion of the ejection head housed in the standby pod.

More preferably, the maintenance part is a vibration part for vibrating an immersion liquid retained in the standby pod, and when a failure in the ejection operation of the ejection head is detected, in the standby pod, the lower end portion of the ejection head is immersed in the immersion liquid retained in the standby pod and the vibration part vibrates the immersion liquid to clean the ejection head.

These and other objects, features, aspects and advantages of the present invention will become more apparent from the following detailed description of the present invention when taken in conjunction with the accompanying drawings.

DESCRIPTION OF EMBODIMENTS

Figure 1:
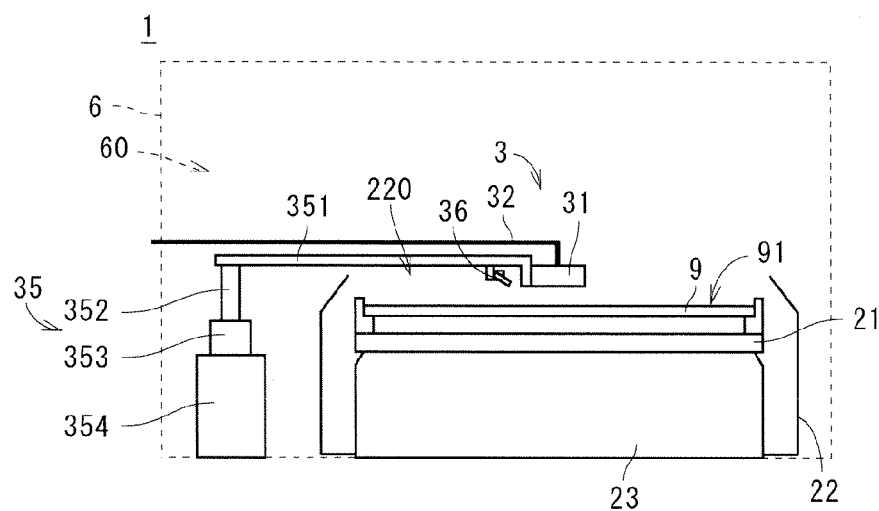
FIG. 1 is a front view of a substrate processing apparatus according to an embodiment of the present invention.
Figure 2:
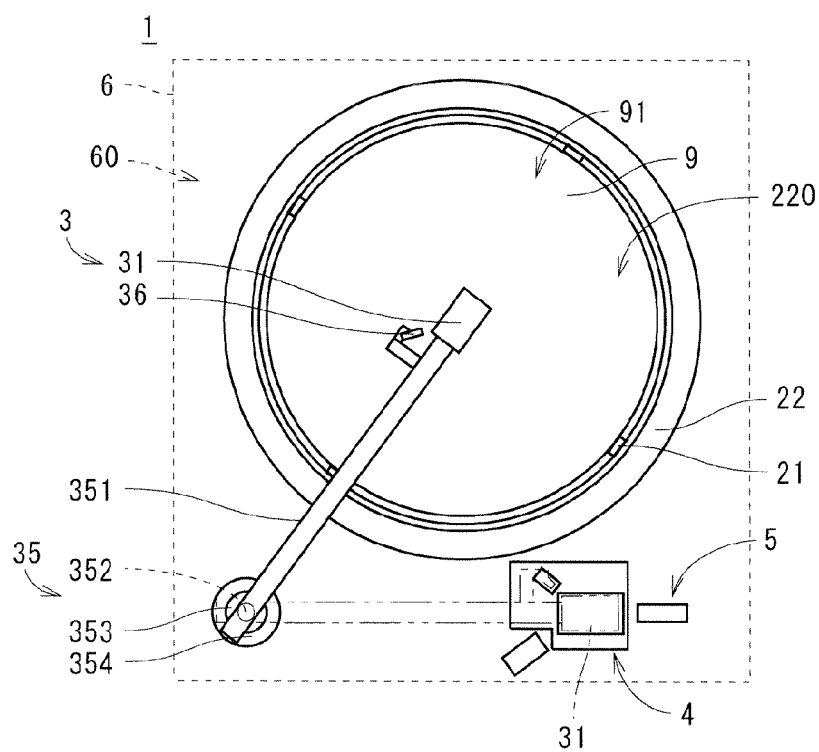
FIG. 2 is a plan view of the substrate processing apparatus.

FIG. 1 is a front view of a substrate processing apparatus 1 according to an embodiment of the present invention. FIG. 2 is a plan view of the substrate processing apparatus 1. An orientation of the substrate processing apparatus 1 in FIG. 2A is different from that in FIG. 1. The substrate processing apparatus 1 is a single-wafer processing apparatus for processing semiconductor substrates 9 (hereinafter, simply referred to as "substrates 9") one at a time. The substrate processing apparatus 1 performs predetermined processing by ejecting a processing liquid toward a substrate 9. In the present embodiment, cleaning processing for removing particles or the like from a substrate 9 is performed by ejecting droplets of a cleaning liquid serving as the processing liquid onto the substrate 9. The substrate processing apparatus 1 ejects, for example, a spray of droplets, each having a diameter of approximately 20 μm (micrometers), toward a substrate 9.

As shown in FIGS. 1 and 2, the substrate processing apparatus 1 includes a substrate holding part 21, a cup part 22, a substrate rotation mechanism 23, a processing liquid supply part 3, a supply part movement mechanism 35, a protection liquid supply part 36, a head standby part 4, an ejection inspection part 5, a chamber 6, and a control unit, which will be described later. The chamber 6 houses constituent elements such as the substrate holding part 21, the cup part 22, the substrate rotation mechanism 23, the processing liquid supply part 3, the supply part movement mechanism 35, the protection liquid supply part 36, the head standby part 4, and the ejection inspection part 5 in its internal space 60. The chamber 6 is a light-tight chamber that prevents the entry of light into the internal space 60 from outside. In FIGS. 1 and 2, the chamber 6 is indicated by a broken line and the interior of the chamber 6 is shown.

The substrate holding part 21 holds a substrate 9 with one main surface 91 (hereinafter, referred to as an "upper surface 91") of the substrate 9 facing upward inside the chamber 6. On the upper surface 91 of the substrate 9 is formed a fine pattern such as a circuit pattern. The cup part 22 is a substantially cylindrical member that surrounds the substrate 9 and the substrate holding part 21. The substrate rotation mechanism 23 is disposed under the substrate holding part 21. The substrate rotation mechanism 23 is configured to rotate the substrate 9 together with the substrate holding part 21 in a horizontal plane around a rotation axis that passes through the center of the substrate 9 and that is perpendicular to the upper surface 91 of the substrate 9.

The processing liquid supply part 3 includes an ejection head 31 for ejecting a processing liquid downward, and processing liquid piping 32 for supplying the processing liquid to the ejection head 31. The ejection head 31 is disposed above the substrate holding part 21 inside the cup part 22. In other words, a lower surface of the ejection head 31 is located between an upper opening 220 of the cup part 22 and the upper surface 91 of the substrate 9. The ejection head 31 is a device for continuously ejecting fine mutually separated droplets of liquid from a plurality of outlets, which will be described later. The ejection head 31 ejects fine droplets of the processing liquid toward the upper surface 91 of the substrate 9. Examples of the processing liquid include liquids such as pure water (preferably, deionized water (DIW)), carbonated water, and a mixture of aqueous ammonia and a hydrogen peroxide solution. A design ejection direction in which the ejection head 31 ejects the processing liquid is substantially parallel to the vertical direction (i.e., the direction of gravity).

Figure 3:
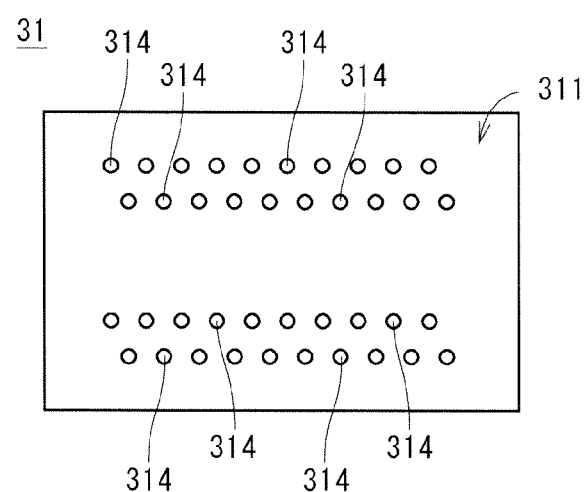
FIG. 3 is a bottom view of an ejection head.

FIG. 3 is a bottom view showing the lower surface 311 of the ejection head 31. In the lower surface 311 of the ejection head 31 are provided a plurality of outlets 314. Hereinafter, the lower surface 311 of the ejection head 31 is referred to as an "ejection surface 311." The outlets 314 form four outlet rows that each extend substantially linearly in the lateral direction in FIG. 3. The outlet rows each have a plurality of outlets 314 arranged at a predetermined arrangement pitch. The outlets 314 each have a diameter of approximately 5 to 10 μm. FIG. 3 shows the outlets 314 larger than their actual size and shows a smaller number of outlets 314 than their actual number.

Figure 4:
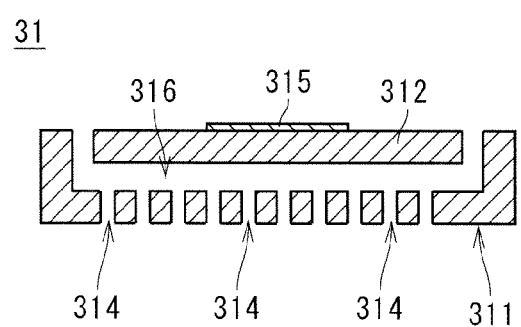
FIG. 4 is a cross-sectional view of the ejection head.

FIG. 4 is a longitudinal cross-sectional view of the ejection head 31. The ejection head 31 includes a head body part 312 and a piezoelectric element 315. Inside the head body part 312 is provided a processing liquid holding part 316 that forms a space for holding the processing liquid. One end of the processing liquid holding part 316 is connected to a processing liquid supply part for supplying the processing liquid to the ejection head 31. The other end of the processing liquid holding part 316 is connected to a processing liquid collecting part for collecting the processing liquid ejected from the ejection head 31. The lower surface of the head body part 312, which is part of the outer surface of the head body part 312, is the aforementioned ejection surface 311. The outlets 314 are each connected to the processing liquid holding part 316. The piezoelectric element 315 is attached to the upper surface of the head body part 312. The piezoelectric element 315 vibrates the processing liquid held in the head body part 312 via the head body part 312 so as to cause the respective outlets 314 to eject fine droplets of the processing liquid.

As shown in FIGS. 1 and 2, the supply part movement mechanism 35 includes an arm 351, a rotation shaft 352, a head rotation mechanism 353, and a head elevating mechanism 354. The arm 351 extends in a horizontal direction from the rotation shaft 352. The arm 351 has the ejection head 31 attached to its tip. The head rotation mechanism 353 is configured to rotate the ejection head 31 together with the arm 351 around the rotation shaft 352 in the horizontal direction. The head elevating mechanism 354 is configured to move the ejection head 31 together with the arm 351 in the vertical direction. The head rotation mechanism 353 includes, for example, an electric motor. The head elevating mechanism 354 includes, for example, a ball screw mechanism and an electric motor.

The protection liquid supply part 36 is directly or indirectly fixed to the ejection head 31 and ejects a protection liquid obliquely downwardly. In the example shown in FIGS. 1 and 2, the protection liquid supply part 36 is attached to the arm 351 and indirectly fixed to the ejection head 31. Examples of the protection liquid include liquids such as pure water (preferably, deionized water), carbonated water, and a mixture of aqueous ammonia and a hydrogen peroxide solution, similarly to the aforementioned processing liquid. The protection liquid may be a liquid of the same type as the processing liquid or may be a liquid of a different type.

With the substrate processing apparatus 1, the protection liquid ejected in the form of a liquid column from the protection liquid supply part 36 toward the upper surface 91 of the substrate 9 spreads over the substrate 9 under the ejection head 31 and forms a film of the protection liquid (hereinafter, referred to as a "protection liquid film") having a predetermined thickness directly under the ejection head 31. The protection liquid supply part 36 is moved together with the ejection head 31 by the head rotation mechanism 353 and the head elevating mechanism 354.

Figure 5:
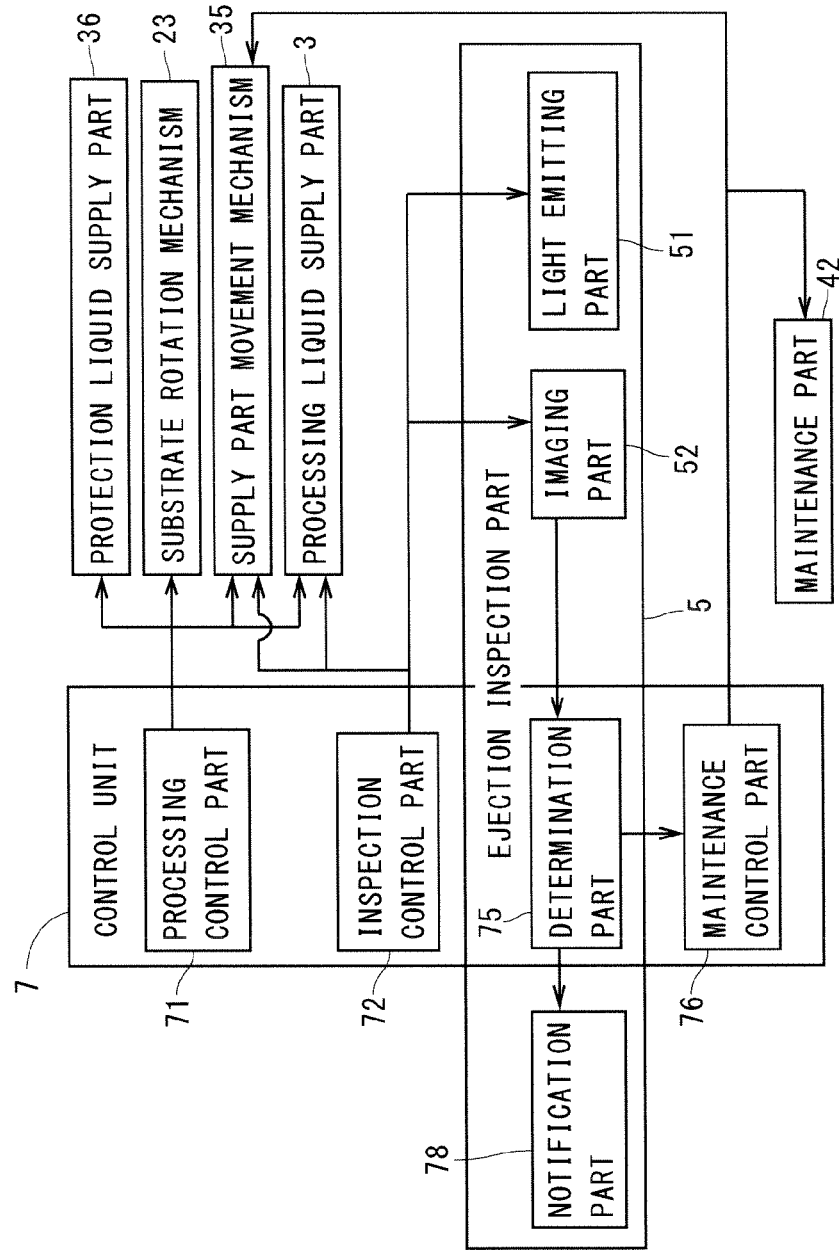
FIG. 5 is a block diagram showing functions of a control unit.

FIG. 5 is a block diagram showing functions of the control unit 7. FIG. 5 also shows constituent elements other than the control unit 7. The control unit 7 includes a processing control part 71, an inspection control part 72, a determination part 75, and a maintenance control part 76. The determination part 75 is also part of the aforementioned ejection inspection part 5. The determination part 75 controls the maintenance control part 76 and a notification part 78 such as a monitor on the basis of its determination results.

When the substrate processing apparatus 1 shown in FIGS. 1 and 2 performs processing on a substrate 9, first a light-tight door (not shown) of the chamber 6, which is capable of being opened and closed, is opened, and the substrate 9 is transported into the chamber 6 and held by the substrate holding part 21. During transport of the substrate 9, the ejection head 31 is waiting at a position above the head standby part 4 disposed outside the cup part 22, as indicated by the dashed double-dotted line in FIG. 2. When the substrate 9 is held by the substrate holding part 21, the light-tight door is closed. Then, the processing control part 71 drives the substrate rotation mechanism 23 to start rotating the substrate 9.

Next, the processing control part 71 drives the head rotation mechanism 353 and the head elevating mechanism 354 of the supply part movement mechanism 35 so that the ejection head 31 and the protection liquid supply part 36 are moved up from the position above the head standby part 4 and rotated, then moved to a position above the cup part 22, and then moved down. Accordingly, the ejection head 31 and the protection liquid supply part 36 are moved through the upper opening 220 of the cup part 22 to the inside of the cup part 22 and to a position above the substrate holding part 21. Then, the protection liquid supply part 36 starts the supply of the protection liquid to the substrate 9, forming a protection liquid film that covers a portion of the upper surface 91 of the substrate 9. Also, the ejection head 31 starts the ejection of the processing liquid (i.e., a jet of fine droplets) from the outlets 314 (see FIG. 3) toward the upper surface 91 of the substrate 9 on which the protection liquid film has been formed. The protection liquid film covers a plurality of design landing points (i.e., landing points of fine droplets) of the processing liquid ejected from the outlets 314 on the substrate 9.

A large number of fine droplets ejected from the ejection head 31 toward the protection liquid film collide with the protection liquid film on the upper surface 91 of the substrate 9 and indirectly collide with the upper surface 91 of the substrate 9 via the protection liquid film. The impact of the collision of the fine droplets of the processing liquid causes extraneous materials such as particles adhering to the upper surface 91 of the substrate 9 to be removed from the substrate 9. In other words, the fine droplets of the processing liquid indirectly transfer kinetic energy (i.e., indirectly apply kinetic energy) to the substrate 9 via the protection liquid film, and with this kinetic energy, the processing for cleaning the upper surface 91 of the substrate 9 is performed.

Such indirect collision of fine droplets of the processing liquid with the substrate 9 via the protection liquid film prevents or reduces the possibility of damage to a pattern or the like formed on the upper surface 91 of the substrate 9 during the processing for cleaning the substrate 9, as compared with direct collision of fine droplets with the substrate 9. In addition, the protection liquid that covers the area where the cleaning processing is performed on the substrate 9 prevents or reduces the possibility that particles or the like once removed from the substrate 9 will again adhere to the upper surface 91 of the substrate 9.

In the substrate processing apparatus 1, in parallel with the ejection of the protection liquid and the processing liquid, the head rotation mechanism 353 turns the ejection head 31 and the protection liquid supply part 36. The ejection head 31 and the protection liquid supply part 36 repeat horizontal reciprocating motion between a position above the center portion of the rotating substrate 9 and a position above the outer edge of the substrate 9. As a result, the entire upper surface 91 of the substrate 9 is cleaned. The rotation of the substrate 9 causes the protection liquid and the processing liquid that have been supplied to the upper surface 91 of the substrate 9 to be dispersed from the edge of the substrate 9 to the outside. The protection liquid and the processing liquid that have been dispersed from the substrate 9 are received by the cup part 22 and either discarded or collected.

After predetermined processing (i.e., processing for cleaning the substrate 9) using the processing liquid ejected from the ejection head 31 has ended, the ejection of the protection liquid and the processing liquid is stopped. The ejection head 31 and the protection liquid supply part 36 are moved up to a position above the upper opening 220 of the cup part 22 by the head elevating mechanism 354 and are then moved from a position above the substrate holding part 21 and the substrate 9 to a position above the head standby part 4 by the head rotation mechanism 353.

Figure 6:
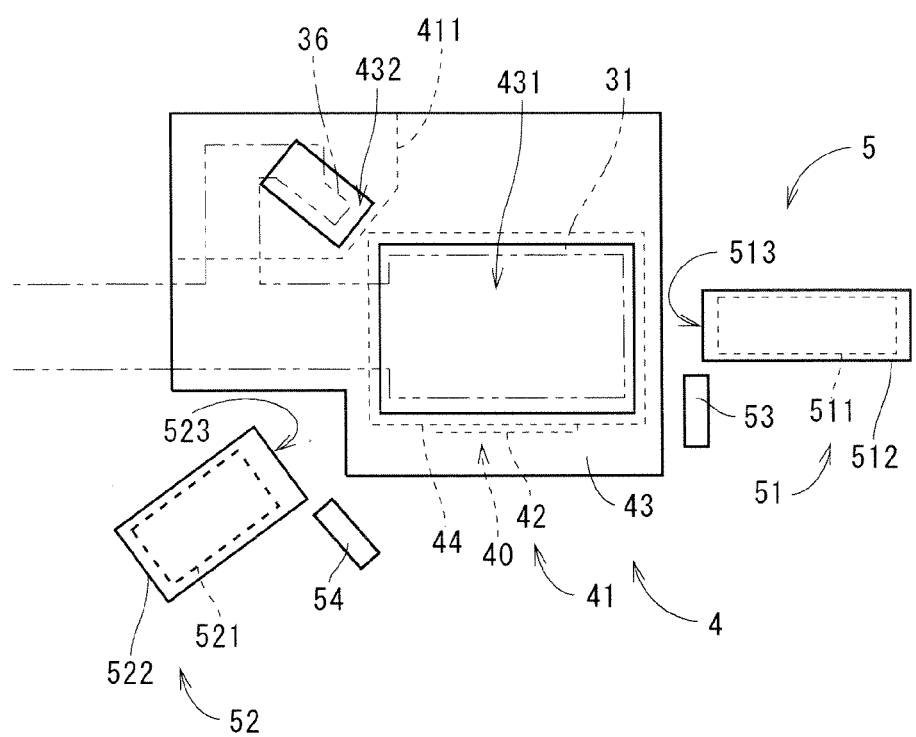
FIG. 6 is a plan view of a head standby part, a light emitting part, and an imaging part.
Figure 7:
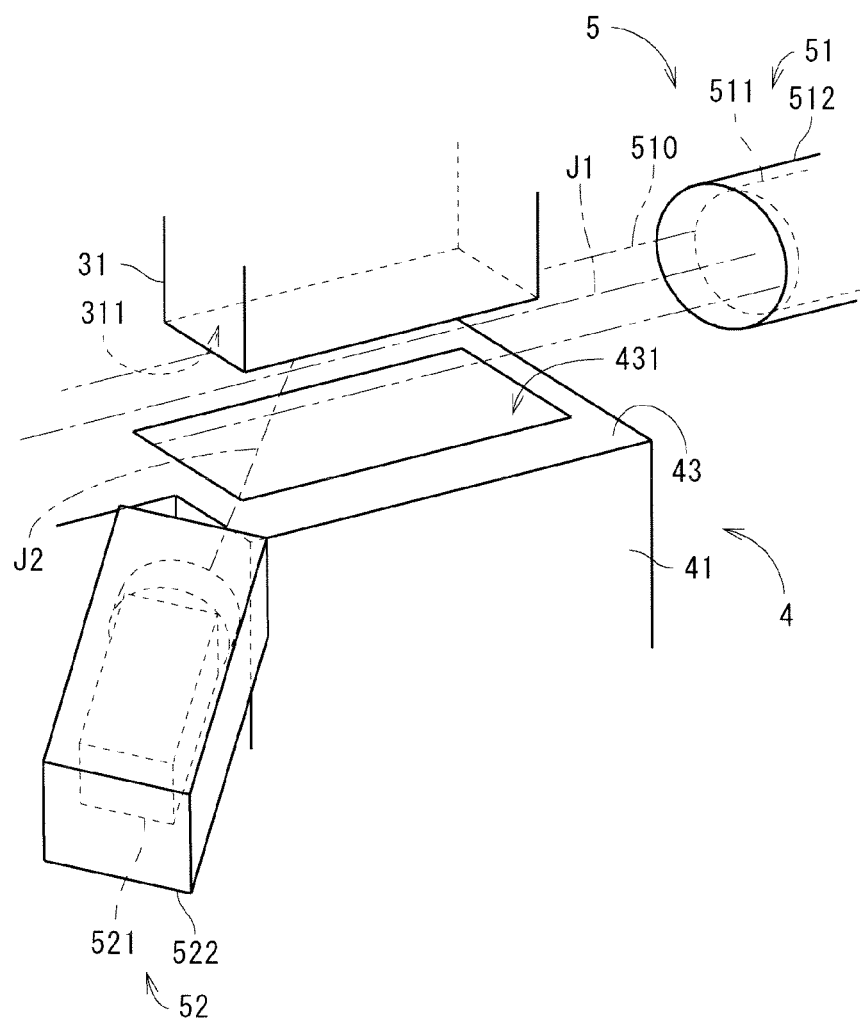
FIG. 7 is a perspective view of the head standby part, the light emitting part, and the imaging part.

FIG. 6 is an enlarged plan view of the head standby part 4 and the ejection inspection part 5. FIG. 7 is an enlarged perspective view of the vicinity above the head standby part 4. The head standby part 4 includes a standby pod 41 and a maintenance part 42. The standby pod 41 is a container disposed outside the cup part 22 and having a substantially rectangular parallelepiped shape, and it is capable of retaining a liquid therein. Specifically, a liquid is retained in a reservoir 44 disposed in an internal space 40 of the standby pod 41. The top of the internal space 40 of the standby pod 41 is covered with a lid part 43. The lid part 43 has a first opening 431 and a second opening 432 that correspond respectively to the ejection head 31 and the protection liquid supply part 36. In FIG. 6, the ejection head 31 and the protection liquid supply part 36 located above the standby pod 41 are indicated by dashed double-dotted lines. The reservoir 44 is located under the first opening 431. The maintenance part 42 is attached to the side surface of the reservoir 44 in the standby pod 41 and is used for maintenance of the ejection head 31. The maintenance part 42 is a vibration part for vibrating the liquid retained in the reservoir 44. One example of the maintenance part 42 is an ultrasonic vibrator.

In FIG. 7, the ejection surface 311 of the ejection head 31 is located above and spaced from the lid part 43 of the standby pod 41. With the ejection head 31 located at the position shown in FIG. 7, an inspection of the ejection operation of the ejection head 31 which will be described later is performed. The inspection of the ejection head 31 is performed, for example, before the start of processing performed on new lots of substrates 9. In the following description, the position of the ejection head 31 shown in FIG. 7 is referred to as an "inspection position."

As shown in FIG. 6, the ejection inspection part 5 includes a light emitting part 51, an imaging part 52, a light-emitting-part cleaning part 53, and an imaging-part cleaning part 54. As shown in FIG. 7, the light emitting part 51 and the imaging part 52 are disposed obliquely below the ejection head 31, avoiding directly under the ejection head 31 located at the inspection position. In FIG. 7, the light-emitting-part cleaning part 53 and the imaging-part cleaning part 54 are not shown.

As shown in FIGS. 6 and 7, the light emitting part 51 includes a light-emitting-part body 511 and a light-emitting-part cover 512. The light-emitting-part cover 512 surrounds the light-emitting-part body 511 and houses therein the light-emitting-part body 511. In other words, the light-emitting-part body 511 is covered with the light-emitting-part cover 512. The light-emitting-part cover 512 is formed of a light conductive material (e.g., transparent polyvinyl chloride). The light-emitting-part body 511 includes a light source and an optical system for converting light emitted from the light source into linear light extending in the substantially horizontal direction. Examples of the light source include a laser diode and a light emitting diode (LED) element.

The light-emitting-part body 511 emits light toward the underside of the ejection head 31 located at the inspection position along a light existing plane that is a predetermined virtual plane. The light emitted from the light-emitting-part body 511 emerges via the light-emitting-part cover 512. In FIG. 7, an optical axis J1 of the light-emitting-part body 511 is indicated by a dashed dotted line, and the outline of planar light emitted from the light-emitting-part body 511 is indicated by dashed double-dotted lines denoted by 510. The planar light 510 emitted from the light emitting part 51 passes through a gap between the ejection surface 311 of the ejection head 31 and the lid part 43 of the standby pod 41. In other words, the aforementioned light existing plane passes through a gap between the lower end of the ejection head 31 located at the inspection position and the upper end of the standby pod 41.

In the substrate processing apparatus 1, the processing liquid is ejected from the outlets 314 (see FIG. 3) of the ejection head 31 located at the inspection position toward the first opening 431 of the standby pod 41, as in the case where the processing liquid is ejected onto the substrate 9. Then, a plurality of flying droplets of the processing liquid ejected from the outlets 314 are irradiated with the light emitted from the light emitting part 51 when passing through the aforementioned light existing plane (i.e., the planar light 510). The planar light 510 is substantially perpendicular to a design ejection direction of the processing liquid from the ejection head 31 (i.e., a predetermined ejection direction of flying droplets). Strictly, it is preferable for the planar light 510 (i.e. the light existing plane) to incline at merely a slight angle (e.g., 5 to 10 degrees) relative to a plane perpendicular to the predetermined ejection direction of flying droplets. Accordingly, more luminous bright dots, which will be described later, will appear on the flying droplets.

As shown in FIGS. 6 and 7 the imaging part 52 includes an imaging-part body 521 and an imaging-part cover 522. The imaging-part cover 522 surrounds the imaging-part body 521 and houses therein the imaging-part body 521. In other words, the imaging-part body 521 is covered with the imaging-part cover 522. The imaging-part cover 522 is formed of a light conductive material (e.g., transparent polyvinyl chloride). The imaging-part body 521 is disposed below the aforementioned light existing plane such that its imaging axis J2 is directed to the planar light 510 located under the ejection head 31. The imaging direction of the imaging part 52 (i.e., the direction in which the imaging axis J2 is directed) inclines relative to a plane perpendicular to the predetermined ejection direction of flying droplets. One example of the imaging-part body 521 is a charge-coupled device (CCD) camera. The imaging part 52 captures an image of the processing liquid (i.e., a plurality of flying droplets) passing through the planar light 510 via the imaging-part cover 522 so as to acquire an inspection image that includes a plurality of bright dots appearing on the plurality of flying droplets. The ejection inspection part 5 extracts a single frame of still image as the inspection image from the result of the image capture by the imaging part 52.

Figure 8:
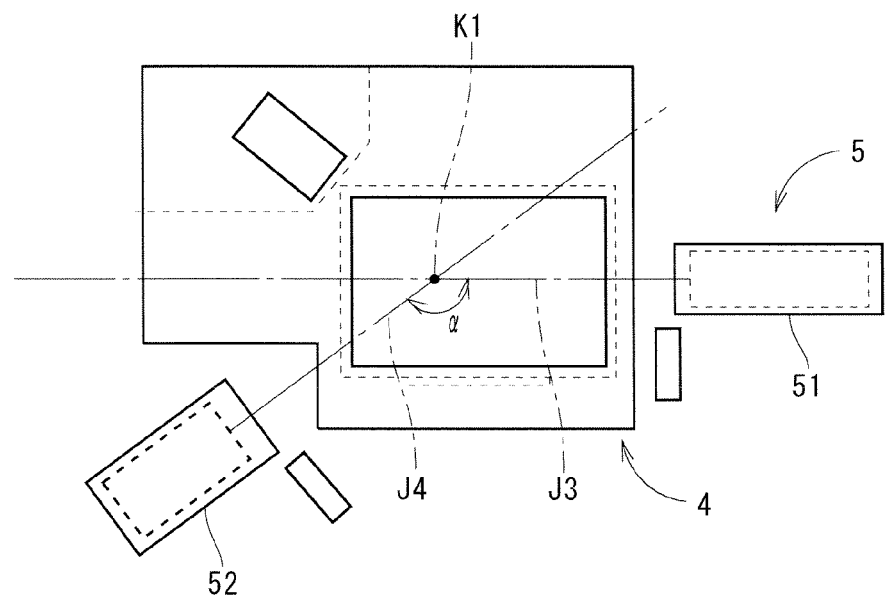
FIG. 8 is a plan view of the head standby part and an ejection inspection part.

FIG. 8 is an enlarged plan view of the head standby part 4 and the ejection inspection part 5, similarly to FIG. 6. A dashed dotted line denoted by J4 indicates a projected imaging axis that is obtained by projecting the imaging axis J2 of the imaging part 52 (see FIG. 7) in the design ejection direction in which the ejection head 31 ejects the processing liquid, on a plane of projection (i.e., a horizontal plane) perpendicular to the design ejection direction. A dashed dotted line denoted by J3 indicates a projected optical axis that is obtained by projecting the optical axis J1 of the light emitting part 51 in the above ejection direction on the above plane of projection. The projected imaging axis J4 and the projected optical axis J3 have a point of intersection K1. An angle α formed by a portion of the projected imaging axis J4 between the point of intersection K1 and the imaging part 52 and a portion of the projected optical axis J3 between the point of intersection K1 and the light emitting part 51 is greater than 90 degrees.

The light-emitting-part cleaning part 53 shown in FIG. 6 is disposed beside a front surface 513 of the light-emitting-part cover 512 (i.e. the surface of the light emitting part 51 on the front side in the direction of light emission), the front surface 513 being part of the outer surface of the light-emitting-part cover 512 and being directed to the ejection head 31 located at the inspection position. The light-emitting-part cleaning part 53 emits gas (e.g., nitrogen gas) toward the front surface 513 of the light-emitting-part cover 512. There are cases where droplets, mist, or the like of the processing liquid ejected from the ejection head 31 toward the substrate 9, the protection liquid ejected from the protection liquid supply part 36 toward the substrate 9, or other liquids used in the substrate processing apparatus 1 may adhere to the front surface 513 of the light-emitting-part cover 512. The emission of the gas from the light-emitting-part cleaning part 53 removes such droplets, mist, or the like of the liquids adhering to the front surface 513 of the light-emitting-part cover 512, thereby cleaning the front surface 513 of the light-emitting-part cover 512.

The imaging-part cleaning part 54 is disposed beside a front surface 523 of the imaging-part cover 522 (i.e., the surface of the imaging-part cover 522 on the front side in the imaging direction), the front surface 523 being part of the outer surface of the imaging-part cover 522 and being directed to the ejection head 31 located at the inspection position. The imaging-part cleaning part 54 emits gas (e.g., nitrogen gas) toward the front surface 523 of the imaging-part cover 522. There are cases where droplets, mist, or the like of the above processing liquid, the above protection liquid, or other liquids used to process the substrate 9 may adhere to the front surface 523 of the imaging-part cover 522, as in the case of the light-emitting-part cover 512. The emission of the gas from the imaging-part cleaning part 54 removes such droplets, mist, or the like of the liquids adhering to the front surface 523 of the imaging-part cover 522, thereby cleaning the front surface 523 of the imaging-part cover 522.

When the substrate processing apparatus 1 performs an inspection of the ejection operation of the ejection head 31, first the inspection control part 72 (see FIG. 5) controls the processing liquid supply part 3 so as to cause the ejection head 31 located at the inspection position above the standby pod 41 shown in FIG. 7 to eject the processing liquid toward the first opening of the standby pod 41. The inspection control part 72 also controls the light emitting part 51 and the imaging part 52 so as to, as described above, acquire an inspection image that includes a plurality of bright dots appearing on a plurality of flying droplets, which form the processing liquid passing through the planar light 510. The acquired inspection image is transmitted to the determination part 75.

The determination part 75 determines the quality of the ejection operations of the respective outlets 314 (see FIG. 3) of the ejection head 31 on the basis of the inspection image received from the imaging part 52. The determination part 75 makes a determination by, for example, preparing a reference image in advance and comparing the reference image with the inspection image, the reference image including a plurality of bright dots appearing on the processing liquid that is ejected normally from the ejection head 31. If the inspection image does not include a bright dot that corresponds to one of the bright dots in the reference image, or if the position of a bright dot in the inspection image is considerably deviated from the position of the corresponding bright dot in the reference image, the determination part 75 determines that an abnormality has occurred in the ejection of the processing liquid from the outlet 314 that corresponds to the above bright dot in the inspection image. Examples of the abnormality in the ejection operation (i.e., an ejection failure) include no ejection where the processing liquid is not ejected from the outlet 314 and oblique ejection where the outlet 314 ejects a droplet in a direction deviated from the predetermined ejection direction. Note that the determination part 75 may use various methods other than comparing the reference image and the inspection image, in order to determine the quality of the ejection operation of the ejection head 31.

Figure 9:
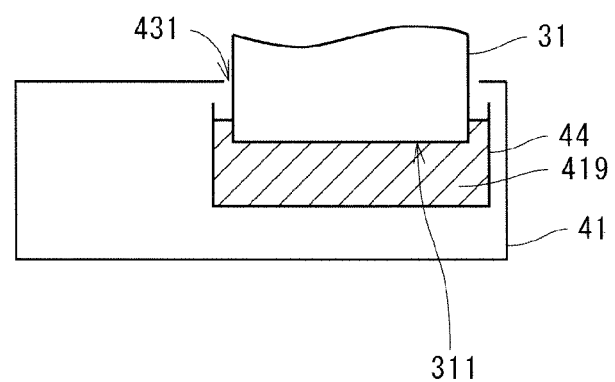
FIG. 9 illustrates the head standby part and the ejection head.

When the determination part 75 has detected a failure in the ejection operation of the ejection head 31, the maintenance control part 76 controls the head elevating mechanism 354 of the supply part movement mechanism 35 to move the ejection head 31 down from the inspection position. Then, the lower end portion of the ejection head 31 is inserted into the standby pod 41 through the first opening 431 of the lid part 43 and is received in the standby pod 41 as shown in FIG. 9. The first opening 431 is an insertion opening through which the lower end portion of the ejection head 31 is inserted. For easy understanding of the drawing, the outer wall of the standby pod 41 and the like are illustrated in cross section in FIG. 9.

In the standby pod 41, the lower end portion of the ejection head 31 is immersed in a liquid 419 (hereinafter, referred to as an "immersion liquid 419") retained in the reservoir 44. For example, a portion of the ejection head 31 up to approximately 5 mm above the ejection surface 311 is immersed in the immersion liquid 419. In the following description, the position of the ejection head 31 shown in FIG. 9 is referred to as a "standby position." A vertical position of the ejection head 31 located at the standby position, i.e., a vertical position of the ejection head 31 when the ejection surface 311 is immersed in the immersion liquid 419 is the same as the vertical position of the ejection head 31 when ejecting the processing liquid toward the substrate 9.

When the ejection head 31 moves from the inspection position down to the standby position, the protection liquid supply part 36 also moves downward together with the ejection head 31. The protection liquid supply part 36 is inserted into the standby pod 41 through the second opening 432 of the lid part 43 shown in FIG. 6 and is received in the standby pod 41. In the standby pod 41, the space in which the lower end portion of the ejection head 31 is housed and the space in which the protection liquid supply part 36 is housed are isolated from each other by a dividing wall 411. There is no liquid retained in the space in which the protection liquid supply part 36 is housed.

When the ejection head 31 is located at the standby position, the maintenance control part 76 (see FIG. 5) controls the maintenance part 42 to vibrate the immersion liquid 419 shown in FIG. 9. Accordingly, the ejection surface 311 or the like of the ejection head 31 immersed in the immersion liquid 419 is cleaned, and clogging or the like of the outlets 314 is cleared. In other words, the maintenance part 42 performs maintenance of the ejection head 31. In the substrate processing apparatus 1, the standby position of the ejection head 31 is also a maintenance position at which the maintenance of the ejection head 31 is performed.

Also in the case where the determination part 75 has determined that the ejection head 31 is conducting a normal ejection operation, the ejection head 31 is moved from the inspection position down to the standby position. Then, the processing liquid supply part 3 stands by with the lower end portion of the ejection head 31 immersed in the immersion liquid 419.

As described above, in the substrate processing apparatus 1, the ejection head 31 is located at the inspection position above the standby pod 41 disposed outside the cup part 22, and the processing liquid ejected from the ejection head 31 is irradiated with the planar light 510 emitted from the light emitting, part 51. Then, the imaging part 52 acquires an inspection image that includes bright dots appearing on the processing liquid, and the determination part 75 determines the quality of the ejection operation of the ejection head 31 on the basis of the inspection image.

Accordingly, it is possible to eliminate the influence of reflected light from the substrate 9 and droplets, mist, or the like of the processing liquid having collided with the substrate 9 and to accurately determine the quality of the ejection operation of the ejection head 31, as compared with the case where the inspection of the ejection operation is performed by the ejection head 31 ejecting the processing liquid onto the substrate 9. In particular, it is conceivable that, if the inspection of the ejection operation is performed at a position above a highly reflective substrate such as a semiconductor substrate, the substrate may produce intense reflected light. However, it is possible with the aforementioned substrate processing apparatus 1 to eliminate the possibility that such intense reflected light will enter the imaging part 52. In addition, the substrate processing apparatus 1 can perform the inspection of the ejection operation of the ejection head 31 in parallel with other processing that does not require the ejection head 31 (e.g., dry processing for removing a liquid on a substrate 9 performed by the substrate rotation mechanism 23 rotating the substrate 9). This results in an improvement in the productivity of the substrate processing apparatus 1.

As described above, the substrate processing apparatus 1 is capable of accurately determining the quality of the ejection operation of the ejection head 31. The structure of the substrate processing apparatus 1 is thus particularly suitable for use in determining the quality of the ejection operation of an ejection head that is relatively difficult to determine the quality of the ejection operation because of the inclusion of a plurality of bright dots in the inspection image, or in other words, an ejection head having a plurality of outlets each ejecting the processing liquid.

In the substrate processing apparatus 1, the aforementioned light existing plane passes through the gap between the lower end of the ejection head 31 located at the inspection position and the upper end of the standby pod 41. Accordingly, bright dots appearing on the processing liquid due to the planar light 510 are located above the standby pod 41. This allows the imaging part 52 to acquire an inspection image more easily than in the case where such bright dots are located in the internal space 40 of the standby pod 41. The imaging part 52 is also capable of acquiring an inspection image with the reduced influence of droplets, mist, or the like of the processing liquid ejected from the ejection head 31 into the standby pod 41. This further improves the accuracy in determining the quality of the ejection operation of the ejection head 31. In addition, because the top of the internal space 40 of the standby pod 41 is covered with the lid part 43, the influence of droplets, mist, or the like of the processing liquid ejected into the standby pod 41 can be further reduced. As a result, the quality of the ejection operation of the ejection head 31 can be determined more accurately.

In the ejection inspection part 5, the light-emitting-part body 511 is housed in the light-emitting-part cover 512, and the imaging-part body 521 is housed in the imaging-part cover 522. This prevents various types of processing liquids used in the substrate processing apparatus 1 from adhering to and thereby adversely affecting the light-emitting-part body 511 and the imaging-part body 521.

The provision of the light-emitting-part cleaning part 53 that cleans the front surface 513 of the light-emitting-part cover 512 eliminates the possibility that droplets, mist, or the like adhering to the light emitting part 51 will adversely affect the irradiation with light. The provision of the imaging-part cleaning part 54 that cleans the front surface 523 of the imaging-part cover 522 also eliminates the possibility that droplets, mist, or the like adhering to the imaging part 52 will adversely affect the image capture. As a result, the quality of the ejection operation of the ejection head 31 can be determined even more accurately.

In the substrate processing apparatus 1, the chamber 6 for housing the ejection head 31 the light emitting part 51, and the imaging part 52 in its internal space 60 serves as a light-tight chamber that prevents the entry of light into internal space 60 from outside. This prevents light other than the planer light 510 emitted from the light emitting part 51 from being reflected off the cup part 22 or the like and included in the inspection image. As a result, it is possible to easily identify bright dots in the inspection image and to more accurately determine the quality of the ejection operation of the ejection head 31.

In the ejection inspection part 5, the angle $\alpha$ formed by the projected optical axis J3 and the projected imaging axis J4 is greater than 90 degrees. This allows the imaging-part body 521 of the imaging part 52 to sufficiently capture forward scattered light coming from the processing liquid irradiated with the planar light 510. This brightens the bright dots in the inspection image and makes it possible to easily extract the bright dots. As a result, the quality of the ejection operation of the ejection head 31 can be determined more accurately.

As described above, in the substrate processing apparatus 1, when a failure has been detected in the ejection operation of the ejection head 31 the maintenance part 42 performs maintenance of the ejection head 31 in a state in which the lower end portion of the ejection head 31 is housed in the standby pod 41. Thus, the maintenance of the ejection head 31 can be performed speedily when an ejection failure has been detected. It is also possible to reduce the possibility that droplets, mist, or the like that can be possibly created during maintenance will be dispersed to the outside of the standby pod 41. Moreover, in the substrate processing apparatus 1, the lower end portion of the ejection head 31 is immersed in the immersion liquid 419 and the maintenance part 42 vibrates the immersion liquid 419 in the standby pod 41. This improves the efficiency of cleaning of the ejection head 31.

The substrate processing apparatus 1 can be modified in various ways.

For example, the light emitting part 51 does not necessarily have to emit planer light, and a configuration is possible in which the light emitting part 51 emits straight forward light along the light existing plane, and the emitted light is scanned along the light existing plane by a light scanner such as a polygon mirror. As a result, a plurality of flying droplets, which form the processing liquid ejected from the outlets 314, are irradiated with the light when passing through the light existing plane. The light existing plane may be perpendicular to the design ejection direction in which the ejection head 31 ejects the processing liquid, and the imaging direction of the imaging part 52 may be parallel to a plane perpendicular to the design ejection direction. The light emitting part 51 and the imaging part 52 may be disposed at positions other than positions obliquely below the ejection head 31 located at the inspection position, and for example, they may be located obliquely above the ejection head 31.

The ejection inspection part 5 may use various methods other than emitting gas from the light-emitting-part cleaning part 53 in order to clean the front surface 513 of the light-emitting-part cover 512. For example, the light-emitting-part cleaning part may include a wiping part such as plate-like rubber and a movement mechanism for moving the wiping part, and may clean the front surface 513 by the wiping part wiping the front surface 513 of the light-emitting-part cover 512. The cleaning of the front surface 523 of the imaging-part cover 522 may also be performed using various methods other than emitting gas from the imaging-part cleaning part 54. For example, as described above, the front surface 523 of the imaging-part cover 522 may be cleaned by wiping with a wiping part.

The ejection inspection part 5 does not necessarily have to be provided with the light-emitting-part cover 512 and the imaging-part cover 522. If the light-emitting-part cover 512 is not provided, the light-emitting-part cleaning part 53 will clean the front surface of the light-emitting-part body 511, which is the surface of the light emitting part 51 on the front side in the direction of light emission. If the imaging-part cover 522 is not provided, the imaging-part cleaning part 54 will clean the front surface of the imaging-part body 521, which is the surface of the imaging part 52 on the front side in the imaging direction.

The substrate processing apparatus 1 may use the piezoelectric element 315 of the ejection head 31 as a maintenance part for performing maintenance of the ejection head 31. For example, if the piezoelectric element 315 is driven while the lower end portion of the ejection head 31 is immersed in the immersion liquid 419, the immersion liquid 419 is vibrated to clean the lower end portion of the ejection head 31. The substrate processing apparatus 1 may also be configured such that, when an ejection failure has been detected in the ejection head 31, the occurrence of the ejection failure is notified to an operator or the like by the determination part 75 via the notification part 78 of the ejection inspection part 5. In addition, the ejection head 31 may be replaced with a new ejection head by an operator or the like.

The processing liquid ejected from the ejection head 31 does not necessarily have to be in the form of droplets, and the ejection head 31 may eject a continuous flow of the processing liquid in the form of a liquid column. The structure of the substrate processing apparatus 1 may be applied to a substrate processing apparatus provided with an ejection head having a single outlet.

The substrate processing apparatus 1 is applicable to various types of processing other than cleaning the substrates 9. The substrate processing apparatus 1 may be used for processing of substrates other than semiconductor substrates, such as glass substrates used in display devices such as liquid crystal displays, plasma displays, and FEDs (field emission displays). The substrate processing apparatus 1 may also be used for processing of other substrates such as optical disk substrates, magnetic disk substrates, magneto-optical disk substrates, photomask substrates, ceramic substrates, and solar cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2013-049861 filed in the Japan Patent Office on Mar. 13, 2013, the entire disclosure of which is incorporated herein by reference.

REFERENCE SIGNS LIST

1 Substrate processing apparatus
6 Chamber
9 Substrate
21 Substrate holding part
22 Cup part
31 Ejection head
35 Supply part movement mechanism
41 Standby pod
42 Maintenance part
51 Light emitting part
52 Imaging part
53 Light-emitting-part cleaning part
54 Imaging-part cleaning part
60 Internal space
75 Determination part
76 Maintenance control part
314 Outlet
419 Immersion liquid
510 Planar light
513 Front surface (of light-emitting-part cover)
523 Front surface (of imaging-part cover)
J1 Optical axis
J2 Imaging axis
J3 Projected optical axis
J4 Projected imaging axis
K1 Point of intersection

The invention claimed is:

1. A substrate processing apparatus for processing a substrate, comprising:
   a substrate holding part for holding a substrate;
   a cup part surrounding said substrate holding part;
   an ejection head disposed above said substrate holding part inside said cup part and for ejecting a processing liquid toward said substrate;
   a standby pod disposed outside said cup part and in which a lower end portion of said ejection head is housed when said ejection head is on standby;
   a supply part movement mechanism for moving said ejection head from a position above said substrate holding part to an inspection position above said standby pod;
   a light emitting part for emitting light along a predetermined light existing plane to irradiate said processing liquid that is ejected from said ejection head toward said standby pod with light when said projection liquid passes through said light existing plane, said ejection head being located at said inspection position;
   an imaging part for capturing an image of said processing liquid passing through said light existing plane to acquire an inspection image that includes a bright dot appearing on said processing liquid; and a determination part for determining quality of an ejection operation of said ejection head on the basis of said inspection image.

2. The substrate processing apparatus according to claim 1, wherein
said light existing plane passes through a gap between a lower end of said ejection head located at said inspection position and an upper end of said standby pod.

3. The substrate processing apparatus according to claim 1, further comprising:
an imaging-part cleaning part for cleaning a front surface of said imaging part in an imaging direction of said imaging part.

4. The substrate processing apparatus according to claim 1, further comprising:
a light-emitting-part cleaning part for cleaning a front surface of said light emitting part in a light emitting direction of said light emitting part.

5. The substrate processing apparatus according to claim 1, wherein
a projected imaging axis and a projected optical axis have a point of intersection, said projected imaging axis being obtained by projecting an imaging axis of said imaging part in an ejection direction in which said ejection head ejects a processing liquid, on a projection plane perpendicular to said ejection direction, and said projected optical axis being obtained by projecting an optical axis of said light emitting part in said ejection direction on said projection plane, and
an angle formed by a portion of the projected imaging axis between said point of intersection and said imaging part and a portion of said projected optical axis between said point of intersection and said light emitting part is greater than 90 degrees.

6. The substrate processing apparatus according to claim 1, further comprising:
a light-tight chamber having an internal space in which said ejection head, said light emitting part, and said imaging part are housed, and for preventing entry of light into said internal space from outside.

7. The substrate processing apparatus according to claim 1, wherein
said ejection head includes a plurality of outlets, each ejecting said processing liquid,
said light emitting part irradiates a plurality of flying droplets passing through said light existing plane with light, said plurality of flying droplets being said processing liquid ejected from said plurality of outlets,
said imaging part captures an image of said plurality of flying droplets passing through said light existing plane to acquire said inspection image that includes a plurality of bright dots appearing on said plurality of flying droplets, and
said determination part determines quality of an ejection operation of each of said plurality of outlets on the basis of said inspection image.

8. The substrate processing apparatus according to claim 7, wherein
said light existing plane passes through a gap between a lower end of said ejection head located at said inspection position and an upper end of said standby pod.

9. The substrate processing apparatus according to claim 8, further comprising:
an imaging-part cleaning part for cleaning a front surface of said imaging part in an imaging direction of said imaging part.

10. The substrate processing apparatus according to claim 9, further comprising:
a light-emitting-part cleaning part for cleaning a front surface of said light emitting part in a light emitting direction of said light emitting part.

11. The substrate processing apparatus according to claim 10, wherein
a projected imaging axis and a projected optical axis have a point of intersection, said projected imaging axis being obtained by projecting an imaging axis of said imaging part in an ejection direction in which said ejection head ejects a processing liquid, on a projection plane perpendicular to said ejection direction, and said projected optical axis being obtained by projecting an optical axis of said light emitting part in said ejection direction on said projection plane, and
an angle formed by a portion of the projected imaging axis between said point of intersection and said imaging part and a portion of said projected optical axis between said point of intersection and said light emitting part is greater than 90 degrees.

12. The substrate processing apparatus according to claim 11, further comprising:
a light-tight chamber having an internal space in which said ejection head, said light emitting part, and said imaging part are housed, and for preventing entry of light into said internal space from outside.

13. The substrate processing apparatus according to claim 12, further comprising:
a maintenance part for performing maintenance of said ejection head; and
a maintenance control part for, when said determination part detects a failure in the ejection operation of said ejection head, controlling said supply part movement mechanism and said maintenance part to move said ejection head down from said inspection position and perform maintenance of said ejection head with said lower end portion of said ejection head housed in said standby pod.

14. The substrate processing apparatus according to claim 13, wherein
said maintenance part is a vibration part for vibrating an immersion liquid retained in said standby pod, and
when a failure in the ejection operation of said ejection head is detected, in said standby pod, said lower end portion of said ejection head is immersed in said immersion liquid retained in said standby pod and said vibration part vibrates said immersion liquid to clean said ejection head.

15. The substrate processing apparatus according to claim 7, further comprising:
an imaging-part cleaning part for cleaning a front surface of said imaging part in an imaging direction of said imaging part.

16. The substrate processing apparatus according to claim 7, further comprising:
a light-emitting-part cleaning part for cleaning a front surface of said light emitting part in a light emitting direction of said light emitting part.

17. The substrate processing apparatus according to claim 7, wherein
a projected imaging axis and a projected optical axis have a point of intersection, said projected imaging axis being obtained by projecting an imaging axis of said imaging part in an ejection direction in which said ejection head ejects a processing liquid, on a projection plane perpendicular to said ejection direction, and said projected optical axis being obtained by projecting an optical axis of said light emitting part in said ejection direction on said projection plane, and an angle formed by a portion of the projected imaging axis between said point of intersection and said imaging part and a portion of said projected optical axis between said point of intersection and said light emitting part is greater than 90 degrees.

18. The substrate processing apparatus according to claim 7, further comprising:

a light-tight chamber having an internal space in which said ejection head, said light emitting part, and said imaging part are housed, and for preventing entry of light into said internal space from outside.

19. The substrate processing apparatus according to claim 1, further comprising:

a maintenance part for performing maintenance of said ejection head; and a maintenance control part for, when said determination part detects a failure in the ejection operation of said ejection head, controlling said supply part movement mechanism and said maintenance part to move said ejection head down from said inspection position and perform maintenance of said ejection head with said lower end portion of said ejection head housed in said standby pod.

20. The substrate processing apparatus according to claim 19, wherein said maintenance part is a vibration part for vibrating an immersion liquid retained in said standby pod, and when a failure in the ejection operation of said ejection head is detected, in said standby pod, said lower end portion of said ejection head is immersed in said immersion liquid retained in said standby pod and said vibration part vibrates said immersion liquid to clean said ejection head.

* * * * *